US00RE37537E

(19) United States
(12) Reissued Patent
Stinnett et al.

(10) Patent Number: US RE37,537 E
(45) Date of Reissued Patent: Feb. 5, 2002

(54) METHOD AND APPARATUS FOR ALTERING MATERIAL

(75) Inventors: Regan W. Stinnett, Albuquerque, NM (US); John B. Greenly, Lansing, NY (US)

(73) Assignee: Sandia Corporation, Albuquerque, NM (US)

(21) Appl. No.: 09/660,463

(22) Filed: Dec. 5, 1997

Related U.S. Patent Documents

Reissue of:
(64) Patent No.: 5,473,165
Issued: Dec. 5, 1995
Appl. No.: 08/153,248
Filed: Nov. 16, 1993

(51) Int. Cl.[7] ..... G21K 5/04
(52) U.S. Cl. ..... 250/492.21; 250/492.3; 250/492.1; 250/423 R; 250/424; 427/523; 315/111.81
(58) Field of Search ..... 250/492.21, 492.2, 250/492.1, 492.3, 423 R, 424; 427/523; 315/111.81

(56) References Cited

U.S. PATENT DOCUMENTS

| | | | | |
|---|---|---|---|---|
| 4,045,677 A | * | 8/1977 | Humphries, Jr. et al. | 250/423 R |
| 4,447,761 A | * | 5/1984 | Stinnett | 250/423 R |
| 4,587,430 A | * | 5/1986 | Adler | 250/423 R |
| 4,733,073 A | * | 3/1988 | Becker et al. | 250/423 P |
| 4,733,091 A | * | 3/1988 | Robinson et al. | 250/442.11 |
| 4,764,394 A | * | 8/1988 | Conrad | 427/38 |
| 5,389,195 A | | 2/1995 | Ouderkirk et al. | |

OTHER PUBLICATIONS

Stinnett, R. W. et al., "Surface Treatment With Pulsed Ion Beams," Division of Plasma Physics, Seattle, Washington Nov. 1992.*

S. Humphries, et al., "Production and postacceleration of intense ion beams in magnetically insulated gaps," J. Appl. Phys. 51(4), pp. 1876–1895, Apr. 1980.

R. T. Hodgson, et al., "Ion beam annealing of semiconductors," Appl. Phys. Lett. 37(2), pp. 187–189, Jul. 15, 1980.

S. Humphries, et al., "Pulsed plasma guns for intense ion beam injectors," Rev. Sci. Instrum. 52(2), pp. 162–171, Feb. 1981.

J. E. E. Baglin, et al., "Pulsed Proton Beam Annealing: Semiconductors and Silicides," Nuclear Instruments and Methods 191, pp. 169–176, (1981).

W. K. Chu, et al., "Pulsed Ion Beam Irradiation of Silicon," Nuclear Instruments and Methods 194, pp. 443–447, (1982).

Lo J. Chen, et al., "Epitaxial $NiSi_2$ formation by pulsed ion beam annealing," Appl. Phys. Lett. 40(7), pp. 595–597, Apr. 1, 1982.

R. Fastow, et al., "Pulsed ion–beam melting of silicon," Physical Review B, vol. 31, No. 2, pp. 893–898, Jan. 15, 1985.

(List continued on next page.)

*Primary Examiner*—Jack Berman
(74) *Attorney, Agent, or Firm*—McDermott, Will & Emery; Paul Devinsky

(57) ABSTRACT

Methods and apparatus for thermally altering the near surface characteristics of a material are described. In particular, a repetitively pulsed ion beam system comprising a high energy pulsed power source and an ion beam generator are described which are capable of producing single species high voltage ion beams (0.25–2.5 MeV) at 1–1000 kW average power and over extended operating cycles ($10^8$). Irradiating materials with such high energy, repetitively pulsed ion beams can yield surface treatments including localized high temperature anneals to melting, both followed by rapid thermal quenching to ambient temperatures to achieve both novel and heretofore commercially unachievable physical characteristics in a near surface layer of material.

86 Claims, 6 Drawing Sheets

OTHER PUBLICATIONS

S. A. Vorob'ev, et al., "Fracture in solids resulting from irradiation by intense ion beams," Sov. Phys. Teach. Phys. 30(6), pp. 713–715, Jun. 1985.

O. KH. Asainov, et al., "Surface Modification of Steel R6M5 Under the Effect of Supercurrent Ion Beams," Phys. Met. Metall., Vo. 60, No. 5, pp. 89–94, 1985.

A. N. Didenko, et al., "Structure Modifications and Mechanical Properties of Alloys Exposed to Pulsed Ion Beams," Nuclear Instruments and Method in Physics Research B17, pp. 165–169, (1986).

A. N. Didenko, et al., "Formation of surface relief on the alloy $Ni_3Fe$ by an intense pulsed ion beam," Sov. Tech. Phys. Lett. 13(5), pp. 217–218, May 1987.

A. E. Ligachev, et al., Increased Microhardness and Wear Resistance of Metals and Alloys HPIB Irradiated, Proc. $6^{th}$ Intl. Conf. on High Power Particle Beams, Osaka, Japan, pp. 634–636, 1988.

G. P. Erokhin, et al., "Modification of the Metal and Alloy Surface Structure Under the Action of Pulsed Ion Beams," Proc. $6^{th}$ Intl. Conf. on High Power Particle Beams, Osaka, Japan, pp. 637–639, 1988.

A. N. Didenko, et al., "Modification of Near the Surface Layers of Metals and Alloys Subjected to PIB," Proc. $6^{th}$ Intl. Conf. on High Power Particle Beams, Osaka, Japan, pp. 617–621, 1988.

A. N. Didenko, et al., "Amorphization of Aloy Surfaces during Irradiation by Nanosecond–Pulsed Ion Beams," Phys. Chem. Mech. Surfaces, vol. 4(1), pp. 296–304, 1986.

J. B. Greenly, et al., "Magentically Insulated Ion Diode with a Gas–Breakdown Plasma Anode," Proc. $6^{th}$ Intl. Conf. on High Power Particle Beams, Osaka, Japan, pp. 196–199, 1986.

A. D. Pogrebnyak, et al., "Modification of the Prooperties of Metals by Hihg–Power Ion Beams," Sov. Phys. Journal, V. 30, No. 1, pp. 39–48, Jan. 1987.

J. B. Greenly, et al., "Magnetically insulated ion diode with a gas–breakdown plasma anode," J. Appl. Phys. 63(6), pp. 1872–1876, Mar. 15, 1988.

I. F. Isakov, et al., "Changed Structure and Improved Operation Characteristics of Metals and Alloys Exposed to High Power Ion Beams," Nuclear Instruments and Methods in Physics Research B28, pp. 37–40, 1987.

A. D. Pogrebnyak, et al., "Increasing the Service Characteristics of Alloys by the Effect of Supercurrent Ion Beams," Fizika i Khimiya Obrabotki Materialov, Vo. 21, No. 6, pp. 4–11, 1987.

A. D. Pogrebnjak, et al., "Structure Modifications and Mechanical Properties of Alloys Exposed to Pulsed Ion Beams," Radiation Effects, Vo. 201, pp. 103–115, 1987.

S. A. Chistjakov, et al., "Ion Mixing of Near Surface Layers in Au–Cu, Cu–Mo Systems Irradiated by HPIB," Physics Letters A, vol. 131, No. 1, pp. 73–77, Aug. 1, 1988.

V, L. Kutuzov, et al., "Mechanical and Frictional Properties of Tool Steels Exposed to HPIB Irradiation," Phys. Stat. Sol. (a) 112, pp. 361–364, 1989.

A. D. Pogrebnjak, et al., "High power Ion–beam induced Melting and Mixing in Deposited Structures," Materials Science and Engineering, A115, pp. 175–179, 1989.

A. D. Pogrebnjak, et al., "Structural, Physical and Chemical Changes Induced in Metals and Alloys Exposed to High Power Ion Beams," Nuclear Instruments and Methods in Physics Research B36, pp. 286–305, 1989.

S. A. Chistjakov, et al., "Dynamical Processes and Changes in Metal Structure Induced by High Power Ion Beams," Nuclear Instruments and Methods in Physics Research B 42, pp. 342–343, 1989.

IEEE Conference Record of the 1990 Nineteenth Power Modulator Symposium, San Diego, California, Jun. 26–28, 1990, H. C. Harjes, et al., "Status of the Repetitive High Energy Pulsed Power Project," pp. 543–548.

IEEE Conference Record of the 1990 Nineteenth Power Modulator Symposium, San Diego, California, Jun. 26–28, 1990, K. W. Reed, et al., "Channel Cooling Techniques for Repetitively Pulsed Magnetic Switches," pp. 192–199.

IEEE Conference Record of the 1990 Nineteenth Power Modulator Symposium, San Diego, California, Jun. 26–28, 1990 H. C. Harjes, et al., "The Repetitive High Energy Pulsed Power Module," pp. 168–173.

A. D. Pogrebnyak, "Metastable States and Structural Phase Changes in Metals and Alloys Exposed to High Power Pulsed Ion Beams," Phys. Stat. Sol. (a), pp. 17–51, 1990.

S. N. Volkov, et al., "Investigation of High Power Ion Beam Generation in B–Applied Diode With Plasma Source At The Anode," Proc $8^{th}$ International Conference on High Power Praticle Beams, B. N. Breizman and BA Knyazev, Gds., USSR pp. 529–534, 1990.

J. B. Greenly, et al., "Plasma–Anode Ion Diode Research at Cornell: Repetitive–Pulse, and 0.1 TW Single–Pulse Experiments," Proc. $8^{th}$ International Conference on High Power Particle Beams, B. N. Breizman and BA Knyazev, Gds, USSR, pp. 199–206, 1990.

O. I. Goncharov, et al., "300–keV High–Poer Ion–Beam Source: Practical Applications," Proceedings of the $8^{th}$ International Conference on High–Power Practical Beams, USSR, pp. 1243–1248, Jul. 1990.

K. Masugata, et al., "Quick Deposition of Various Thin Films by Intense Pulsed Ion Beams," Proceedings of the $8^{th}$ International Conference on High–Power Practical Beams, USSR, pp. 1254–1260, 1990.

Digets of Technical Papers, Eighth IEEE International Pulsed Power Conference, Jun. 16–19, 1991, Kenneth Prestwich, et al., "Initial Results from the Unitolar operations of the RHEPP Module," pp. 83–95.

V. A. Shulov, et al., "Processing with energetic ion beams to repair and clean parts," Pis'ma Zh. Tekh. Fiz. 17, 38–42, pp. 621–622, Sep. 12, 1991.

I. F. Isakov, et al., "Sources of high power ion beams for technological applications," Vacuum, vol. 42, Nos. 1, 2, pp. 159–162.

Conference Records of the 1992 Twentieth Power Modulator Symposium, C. Harjes, et al., "Characterization of the RHEPP 1$\mu$s Magnetic Pulse Compresion Module," pp. 787–790.

Conference Record of the 1992 Twentieth Power Modulator Symposium, R. W. Wavrik, et al., "Thermal Management in High Average Power Pulsed Compression Systems," pp. 223–226.

G. Romanov, et al., "Structural, Mechanical and Frictional Behavior, Tool Steels Treated by the High–Energy Ion Beams,"Soviet Journal of Priction and Wear, Vo. 13, No. 5, 1992.

G. E. Remnev, et al., "Practical Applications of High–Power Ion Beams," Proceedings of the $9^{th}$ International Conference on High–Power Particle Beams, Washington, D.C., May 25–29, 1992.

Digets of Technical Papers Ninth IEEE International Pulsed Power Conference, Jun. 21–23, 1993 D. L. Johnson, et al., "Results of Initial Testing of the Four Stage RHEPP Accelerator," pp. 437–440.

M. Ueda, et al., "Inductively driven gas–breakdown plasma source for intense ion beam production," Rev. Sci. Instrum. 64 (10), pp. 2737–2745, Oct. 1993.

* cited by examiner

Before

After

METHOD AND APPARATUS FOR ALTERING MATERIAL

Matter enclosed in heavy brackets [ ] appears in the original patent but forms no part of this reissue specification; matter printed in italics indicates the additions made by reissue.

The United States Government has rights in this invention pursuant to Contract No. DE-AC04-76DP00789 between the Department of Energy and American Telephone and Telegraph Company.

BACKGROUND OF THE INVENTION

The present invention relates generally to methods and apparatus for altering material. More particularly, the present invention describes methods and apparatus for thermally altering the near surface characteristics of a material with a high energy, repetitively pulsed ion beam.

A variety of techniques have been developed for thermally altering the near surface characteristics of a material using ion beam, electron beam, x-ray and laser technologies. Unfortunately, the dramatic expectations of such technologies have largely gone unfulfilled. In particular, the use of lasers for thermally altering the near surface characteristics of materials has met with only limited commercial success. The more significant reasons for such poor reception are: 1) high cost per area treated, 2) short (<50 nm) deposition depths in metals, 3) high reflectivity of metal surfaces, 4) large variations in photon absorption leading to non uniform treatment due to defects and non-uniformities in treated surfaces, and 5) low power levels require the use of small (typically $\leqq 1$ cm$^2$) beam spots which must then be swept across a surface to treat large areas which can lead to undesirable mechanical and electrical edge effects in surfaces treated with swept beams.

The use of ion beams for thermally altering the near surface characteristics of a material, while the most promising, has been fraught with the most substantial problems. Most notable of the limitations with existing ion beam technologies have been: 1) high costs per area treated, 2) the inability to generate a large number of pulses without the costly replacement of ion beam generator components, 4) low repetition rates, 5) low average power, and 6) the inability to reliably produce a uniform ion beam of a single selectable ion species. Typical ion beam generators use dielectric surface arcing on an anode as a source of ions and thereafter magnetically or geometrically direct and focus the generated ion beam onto the material of interest. This surface arcing (also called "flashover") destroys the anode surface in <100 pulses, and produces a mixed species of ions that cannot be adjusted. Other difficulties arising from flashover include: the production of large quantities of neutral gas that makes high repetition rate difficult, generated debris can contaminate surfaces being treated, and non uniformity and irreproducibility of the beam in some cases due to the localized and difficult to control nature of flashover.

Present ion beam generators are typically "one shot" devices, i.e. they operate at repetition rates <<1 Hz. The principal limitations in operating existing ion beam generators at repetition rates >>1 Hz are threefold. First, the inability to repetitively generate high voltage (>0.25 MeV), low impedance (<<100 Ω) high average power (>$10^9$ watts), electrical pulses in the -range of 30–500 nanoseconds in duration. Second, the inability of the ion beam generator to operate repetitively for an extended number of operating cycles (>>$10^3$) without replacement of major components. Third, the inability to operate with electrical efficiencies >5%. These limitations alone have made it impossible to consider industrial applications of the ion beam technology for surface treating materials.

The present apparatus for generating high energy, repetitive ion beam has over come the limitations of existing ion beam generators and provides a cost effective processing technology for thermally altering the near surface characteristics of materials.

SUMMARY OF THE INVENTION

The present invention provides a system for generating a high energy, ion beam repetitively over an extended number of operating cycles. In particular, the present invention provides an ion beam generator capable of high average power and repetitive operation over an extended operating cycle for thermally treating large surface areas of a material at low cost. The ion beam generator comprises a high energy, pulsed power system and an ion beam source both capable of high repetition rates, and both have an extended operating life. High energy, repetitively pulsed ion beams produced according to the present invention can produce surface treatments ranging from localized high temperature anneals to melting, both followed by rapid thermal quenching to ambient temperatures. In metals this can produce complex surface alloys, liquid phase mixing of layers of different materials, and/or non-equilibrium microstructures including amorphous, disordered crystalline, and nanocrystalline phases. Other applications include etching and cross-linking of polymers, surface glazing and sealing of ceramic surfaces and cost-effective dry processes for surface deburring, polishing, and cleaning without the use of solvents. The unique energy deposition in-depth characteristic of high energy, repetitively pulsed ion beams also allows this technology to be used as a new technique for bonding of films to substrates. The depth of treatment can be controllable by varying the ion energy and species as well as pulse duration or length.

DETAILED DESCRIPTION OF THE INVENTION

The present invention provides an ion beam generator capable of high average power and repetitive operation over an extended number of operating cycles for thermally treating large surface areas of materials at commercially attractive costs. In particular, the ion beam generator of the present invention can produce high average power (1–1000 kW) pulsed ion beams at 0.25–2.5 MeV energies and pulse durations or lengths of 30–500 nanoseconds (ns). The ion beam generator can directly deposit energy in the top 1–50 micrometers ($\mu$m) of the surface of any material. The depth of thermal treatment can be controlled by varying the ion energy and species as well as the pulse length.

Figure 1:
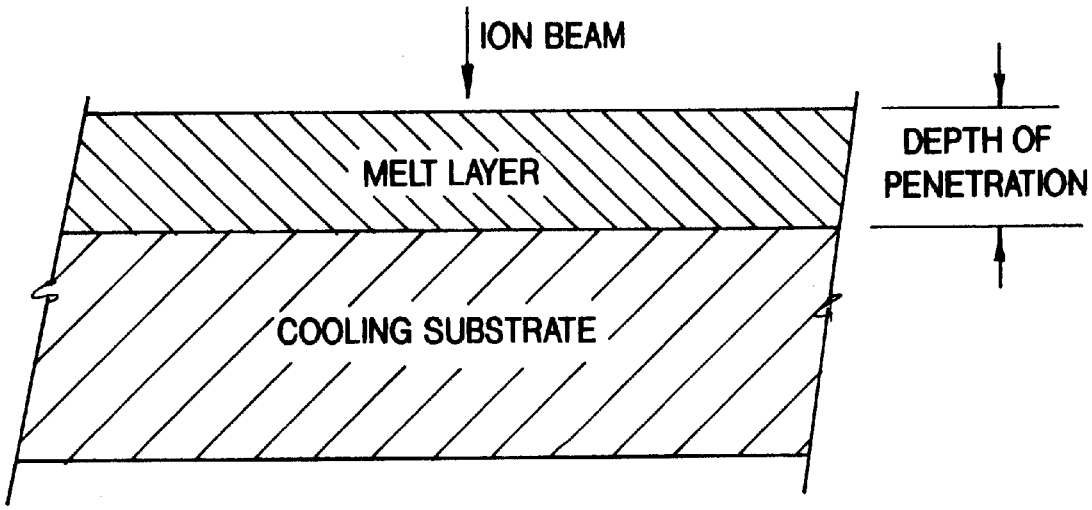
FIG. 1 depicts the deposition of ion beam energy in a near surface layer raising its temperature to melt with thermal diffusion into the underlying substrate.

Irradiating a material with ion beams in accordance with the present invention is a thermal process that does not significantly change the atomic composition of the material. Instead it thermally heats the near surface using typically $3\times10^{13}$ ions/cm$^2$ per pulse, only approximately $10^{-5}$–$10^{-3}$ atomic percent of the sample density. Deposition of ion beam energy in a thin near surface layer allows melting of the layer with relatively small energies (typically 1–10 J/cm$^2$) and allows rapid cooling of the melted layer by thermal diffusion into the underlying substrate as depicted in FIG. 1. The relatively small energy densities needed for treatment together with the high instantaneous powers available using the present invention allows large surfaces areas (up to 1000 cm$^2$) to be treated with a single ion beam pulse greatly reducing or eliminating edge effects at the transition between treated and untreated areas. The relatively short ion beam pulse lengths, preferably $\leqq$200 ns, developed by the ion beam generator limit the depth of thermal diffusion, thus allowing the treated/melted region to be localized to a selected depth.

Typical cooling rates of the present invention ($10^8$–$10^{10}$ K/sec) are sufficient to cause amorphous layer formation in some materials, fine grain structures in some materials, the production of non-equilibrium microstructures (nanocrystalline and metastable phases), and the formation of new alloys by rapid quenching and/or liquid phase mixing of layers of different materials. Such rapid thermal quenching (>$10^8$ K/sec) can significantly improve corrosion, wear and hardness properties of the treated near surface layer. Other applications of the present invention can include etching and cross linking of polymers, surface glazing and sealing of ceramic surfaces for reduced porosity, and a cost-effective, solvent-free process for surface deburring, polishing, cleaning, and oxide layer removal.

Figure 2:
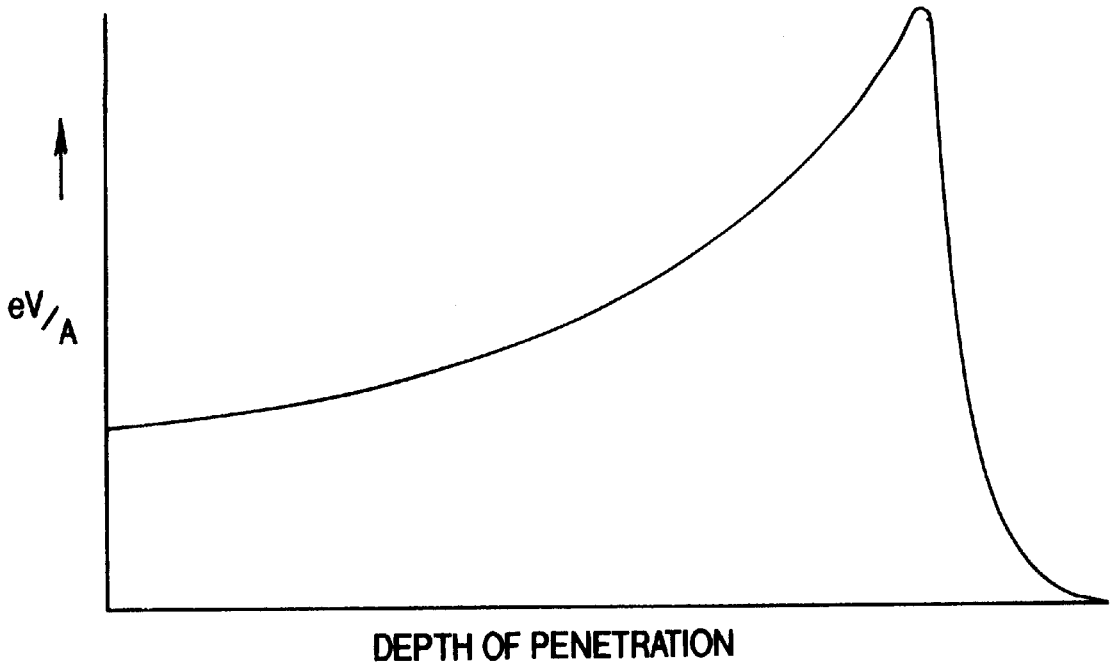
FIG. 2 depicts the in depth deposition of energy in steel for a 900 keV proton beam.

The unique energy deposition as a function of depth, as depicted in FIG. 2, also allows ion beams produced according to the present invention to be used for bonding films to substrates and mixing interface materials by liquid phase mixing. Surface modification by rapid, localized melting, with or without vaporization of the surface can be used for annealing of surfaces and modifying surface microstructure, including metals, semiconductors, and polymers. The microstructures produced will be determined by the choice of material, the beam intensity, energy, composition, and the number of pulses used to treat an area.

The ion beam generator can also produce pulsed ion beams with intensities sufficient to vaporize surface layers. Applications of this capability include the production of high energy vapor for depositing films. The ion beam generator can also be used for ion implantation at relatively high voltages (0.25–2.5 MV), with greatly reduced cost, greater depths, and larger treatment area due to the higher energy per pulse, higher voltage, and low cost, repetitive capability of this new technology. At higher intensities, the ion beam generator can also be used to produce surface ablation that creates shock waves that propagate into materials, causing dislocations and increasing the hardness of the material.

The ion beam generator of the present invention is composed of two major components: a high energy, pulsed power system and an ion beam source both capable of high repetition rates and both having extended operating lives.

The first of these components is a compact, electrically efficient, repetitively pulsed, magnetically switched, pulsed power system capable of $10^9$ pulse operating cycles as generally described by H. C. Harjes, et al, Pro 8th IEEE Int. Pulsed Power Conference (1991) all of which is incorporated by reference herein. The power system can operate continuously at a pulse repetition rate of 120 Hz delivering up to 2.5 kJ of energy per pulse in 60 ns pulses. The power system can deliver pulsed power signals of 30–500 ns duration with ion beam energies of 0.25–2.5 MeV. The power system can operate at 50% electrical efficiency from the wall plug to energy delivered to a matched load. The power system uses low pulse compression stages incorporating, for example, low loss magnetic material and solid state components, to convert AC power to short, high voltage pulses. High electrical efficiency is important in reducing the cooling requirements and the capital and operating costs of the power system. The ability to produce voltages from 250 kV to several MV by stacking voltage using inductive adders incorporating low loss magnetic material is also an important feature when high voltages are needed although it is also possible to use a single stage, eliminating the need for the adder. The power system can operate at relatively low impedances (<<100 Ω) which also sets it apart from many other repetitive, power supply technologies such as transformer-based systems. This feature is necessary to allow high treatment rates and the treatment of large areas (up to 1000 cm$^2$) with a single pulse so as to reduce edge effects occurring at the transition between treated and untreated areas.

Figure 3:
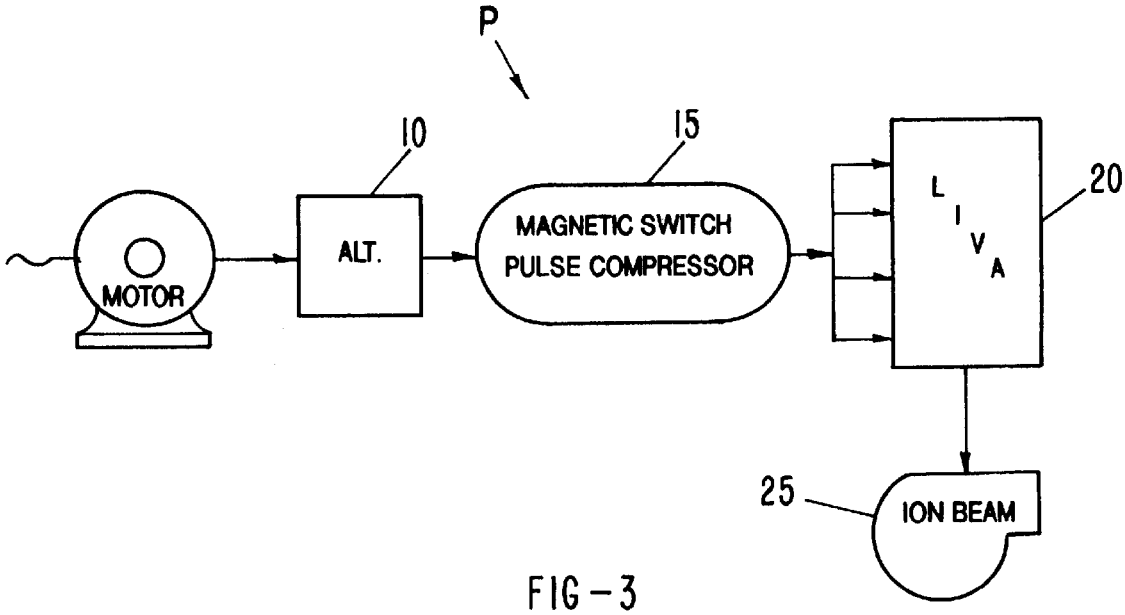
FIG. 3 is a schematic of the pulsed power system of the present invention.

A block diagram of the power system P is shown in FIG. 3. From the prime power input, several stages of magnetic pulse compression and voltage addition are used to deliver a pulsed power signal of up to 2.5 MV, 60 ns FWHM, 2.9 kJ pulses at a rate of 120 Hz to an ion beam source. The power system P converts AC power from the local power grid into a form that can be used by the ion beam source. In one embodiment of the invention, the power system P comprises a motor driven 600 kW, 120 Hz alternator 10. In the unipolar mode it provides 210 A rms at a voltage of 3200 V rms with a power factor of 0.88 to a pulse compressor system 15. In an alternative embodiment, the alternator 10 can be replaced by a variable frequency modulator (not shown). Such modulator can deliver a 5 kJ, (1−cos ωt) voltage pulse to the pulse compressor system 15 with a time to peak that permits the elimination of the first 2 or 3 stages in the pulse compressor system 15. The modulator can have a variable pulse repetition frequency (prf) and consequently will be a more flexible power source for the ion beam source (i.e. the input power can be adjusted by simply changing the prf).

The pulse compression system 15 can provide unipolar, 250 kV, 15 ns rise, 60 ns FWHM, 4 kJ pulses, at a rate of 120 Hz, to a linear inductive voltage adder (LIVA) 20. In one embodiment, the pulse compression system 15 is a common magnetic pulse compressor composed of a plurality of magnetic switches (i.e. saturable reactors) the operation of which is well known to those skilled in the art. In order to satisfy the systems performance requirements, the pulse compression system 15 should have an efficiency 80% and be composed of high reliability components with very long lifetimes ($\sim 10^9$–$10^{10}$ pulses). Magnetic switches are preferably used in all of the pulse compression stages because they can handle very high peak powers (i.e. high voltages and currents), and because they are basically solid state devices with the potential to satisfy the lifetime requirement.

The LIVA 20 is a liquid dielectric insulated voltage adder and can deliver nominal 2.5 MV, 2.9 kJ, pulses at a rate of 120 Hz to the ion beam source 25. The nominal output pulse of the LIVA 20 is trapezoidal with 15 ns rise and fall times and 60 ns FWHM.

The second component of the present invention is an ion beam source or accelerator capable of operating repetitively and efficiently to transform the pulsed power signal from the power system efficiently into an ion beam as described generally by J. B. Greenly et al, "Plasma Anode Ion Diode Research at Cornell: Repetitive Pulse and 0.1 TW Single Pulse Experiments", Proceedings of 8th Intl. Conf. on High Power Particle Beams (1990) all of which is incorporated by reference herein. The ion beam source is capable of operating at repetitive pulse rates of 100 Hz continuously with long component lifetimes $>10^6$. Preferably, the ion beam source comprises a magnetically-confined anode plasma (MAP) source, which draws ions from a plasma anode rather than a solid dielectric surface flashover anode used in present single pulse ion beam sources. The MAP source can provide pure beams of different ion species without employing components or techniques that have intrinsically short lifetimes. The ion beam generates is pulsed rather than continuous, allowing more compact, less expensive equipment to achieve high ion energies. Any ion can be used to deposit the energy. Protons have the greatest penetration depth of any ion and thus provide the greatest treatment depth while higher mass ions can deposit their energy at lesser depths.

Figure 4:
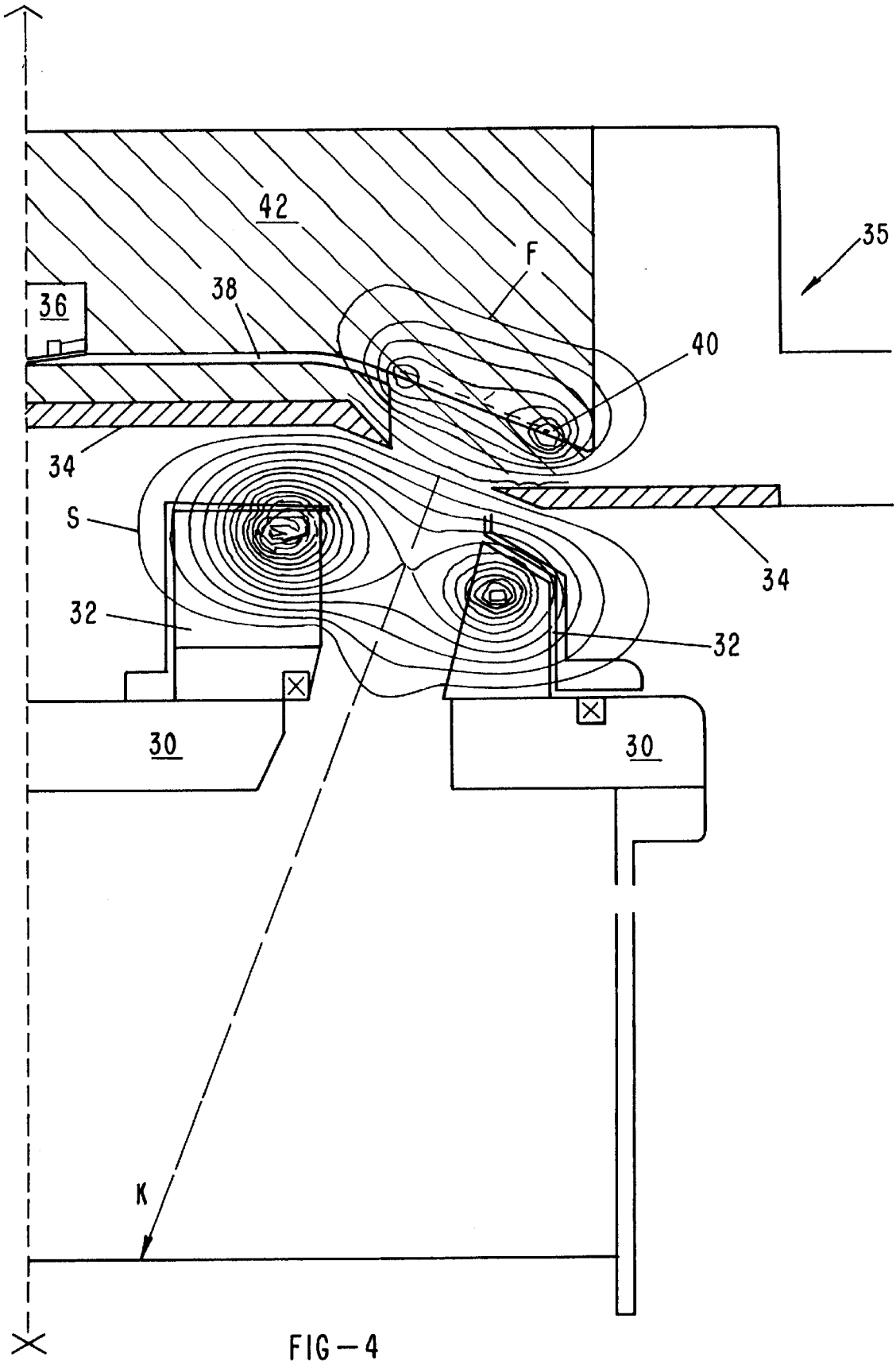
FIG. 4 is a schematic of the MAP source of the present invention.

The MAP source M is shown in FIG. 4. In particular, FIG. 4 is a partially cross-sectional view of one symmetric side of the MAP source M. The MAP source M produces an annular ion beam K which can be brought to a broad focus symmetric about the axis X—X shown. In the cathode electrode assembly 30 slow (1 $\mu$s rise time) magnetic field coils 32 produce magnetic flux S which provides the magnetic insulation of the accelerating gap between the cathode 32 and the anode electrode assembly 34 and which is connected to the output of the pulsed power system (not shown). The anode electrodes 34 also act as magnetic flux shapers.

The MAP M source operates in the following fashion: a fast gas valve 36 on the axis of anode assembly 35 produces a rapid (200 $\mu$s) gas puff which is delivered through a supersonic nozzle 38 to produce a highly localized volume of gas directly in front of the surface of a fast driving coil 40 located in an insulating structure 42. After pre ionizing the gas with a 1 $\mu$s induced electric field, the fast driving coil 40 is energized, inducing a loop voltage of 20 kV on the gas volume, driving a breakdown to full ionization, and moving the resulting plasma toward the flux shaping electrodes 34 in about 1.5 $\mu$s, to form a thin magnetically-confined plasma layer. The pulsed power signal from the power system is then applied to the anode assembly 35, accelerating ions from the plasma to form the ion beam K. The slow (S) and fast (F) magnetic flux surfaces, at time of ion beam extraction, are also shown.

The plasma can be formed using a variety of gases. This ion source system can use any gas (including hydrogen, nitrogen and argon) or high vapor pressure liquid or metal to produce a pure source of ions without consuming or damaging any component other than the gas supplied to the source. The ion beam K propagates 20–30 cm in vacuum ($\sim 10^{-3}$) to a broad focal area (up to 1000 $cm^2$) at the target plane where material samples are placed for treatment and can thermally alter areas from 50 $cm^2$ to 1000 $cm^2$.

Operation of the MAP source depends in part on the ability to provide ions at current densities exceeding by factors of several those available using standard space charge limited flow defined by the geometric gap and voltage. This is done by forming a virtual cathode consisting of electrons emitted from the cathode near the ion source on the anode.

The present invention provides a system and a process for generating high voltage ion beams repetitively over an extended number of operating cycles in a manner that satisfies several criteria and constraints imposed by the use of this technology for the efficient treatment of surfaces in commercial applications. In particular, the present invention comprises a pulsed power system and an ion beam source that are designed and combined in such a way as to satisfy the following criteria.

Pulse Length

The operation of high current, pulsed ion beam source depends in part on the ability to provide ions at current densities exceeding by factors of several those available using standard space charge limited flow defined by the geometric gap and voltage. This is done by forming a virtual cathode consisting of electrons emitted from the cathode near the ion source on the anode. A carefully optimized magnetic field topology is required to confine these electrons to form a sheath extending from the cathode to the anode in the ion emitting region of the anode. In the simplest model these electrons fill the gap in a few nanoseconds, providing a space charge profile in the gap that allows ion current densities to be much larger than those available without the virtual cathode formed by the electron sheath filling the anode-cathode gap. Experiments show that the delay in obtaining enhanced ion current density is 10–20 ns. This places a lower limit on the pulse length required for reasonable efficiency of the system. Based on this information the pulse length above half voltage points should be at least 30 ns.

Voltage, Current, and Impedance

The voltage, current and impedance of the pulsed power system required for effective, repetitive ion beam surface treatment is constrained by several factors. These include the need to generate large enough voltages to obtain the needed depth of penetration of ions into materials. This voltage is at least 250 kV for multi-micron penetration depth and extends to several MV. A typical operating voltage is 0.75 MV. The energy deposition depth of protons in steel is approximately 5 microns at this voltage. The current density needed to provide 5 $J/cm^2$, a typical level needed to melt surfaces to this depth, is approximately 100 $A/cm^2$ for a 60 ns pulse. In order to treat a 100 $cm^2$ area (large enough to minimize edge effects) a total ion current of 10,000 Amperes is needed. A 67% ion efficiency gives total current and impedance requirements of 15,000 Amperes and 50 Ω respectively. In generally these considerations lead to an ion source impedance significantly less than 100 Ω, at voltages of at least 250 kV.

Ion Beam Source

The ion beam source must satisfy several criteria that are unique to its combination in repetitively pulsed, long lifetime, high voltage systems for pulsed ion beam treatment of surfaces. The ion beam source must produce only low levels of gas during operation to prevent vacuum degradation beyond the $1\times10^{-3}$ Torr level between pulses. The ion beam generated must be extractable through any insulating magnetic field with little or no rotation to allow propagation of the ion beam in a field-free region and focusing of the beam at intensities up to several tens of Joules/square centimeter on a material surface at least 20 centimeters away from the ion beam source. Many ion beam systems, including previous Magnetically confined Anode Plasma systems were fundamentally incapable of this because of incompatible magnetic field configurations in the diode (ion beam generating section). In particular, previous MAP sources produced an ion beam which rotated. Such rotation can result in the rapid dispersal of the ion beam as it propagates in free space. In the present invention it is necessary for the ion beam to travel up to 20–30 cm to a material surface and as such rotation of the ion beam is unacceptable.

EXAMPLES

Applications of present invention include production of low cost materials with treated surfaces for handling corrosive environments and treatment of large area metal sheets and critical components used in manufacturing and other areas where hardness, toughness and corrosion or wear resistance are important. It can also be used to produce smooth, crack-resistant ceramic surfaces by melting and re solidification using pulsed ion beams. By varying ion beam deposition levels and pulse durations it is also possible to use this technology for either surface cleaning or annealing. At high deposition levels (~30 J/cm$^2$) it is possible to do shock hardening of materials. Polymer processing and ion implantation can be done at lower deposition levels.

Figure 5:
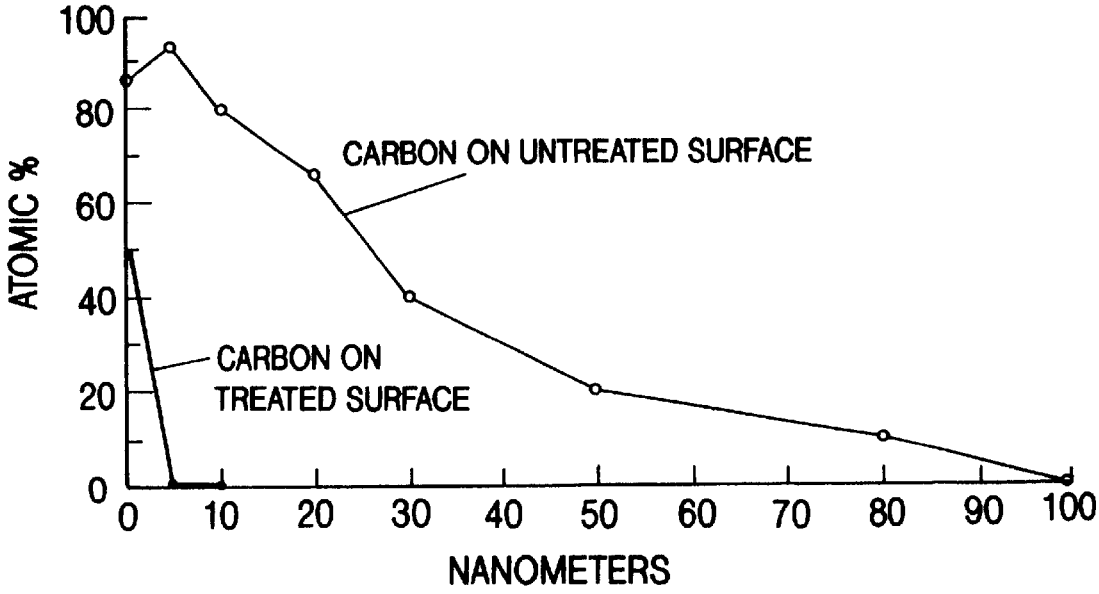
FIG. 5 depicts the effectiveness in removing a 100 nm thick coating of machining oil from a stainless steel 304 sample. After treatment with an ion beam of 1–2 Joules per square centimeter of 0.75 MeV carbon ions the hydrocarbon contamination layer was removed leaving only normal atmospheric contamination.
Figure 6:
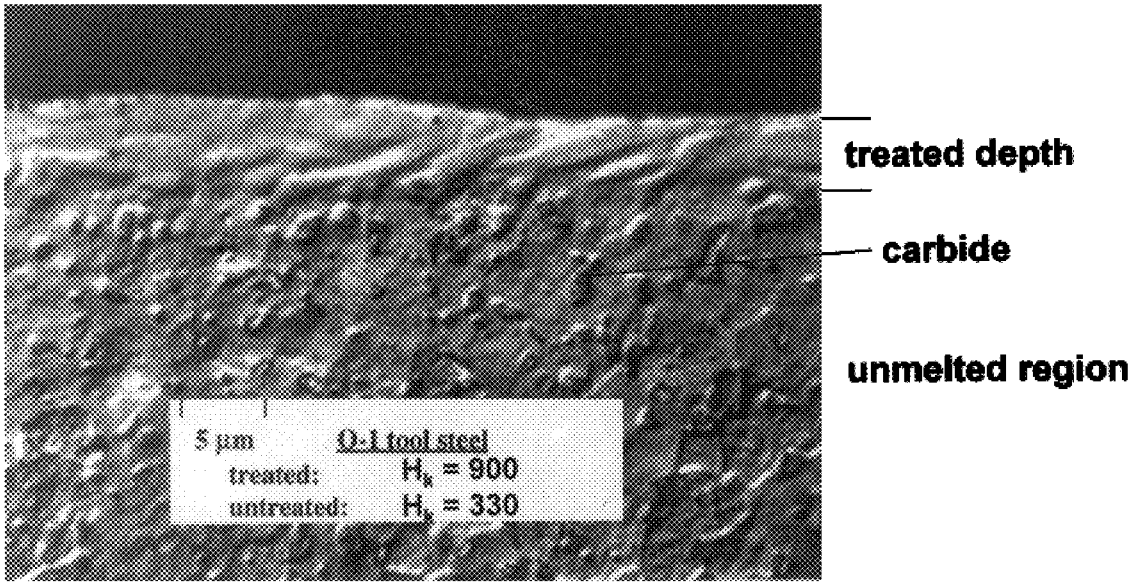
FIG. 6 is a cross sectional view of an 0–1 tool steel sample showing the effects of rapid surface melting and cooling by a 60 ns, 10 J/cm$^2$, 1 MeV mixed proton and carbon beam which resulted in increased hardness as well as a mixture of amorphous and fine grained material with retained metastable austenite and dissolved carbide precipitates retained in solution.
Figure 7B:
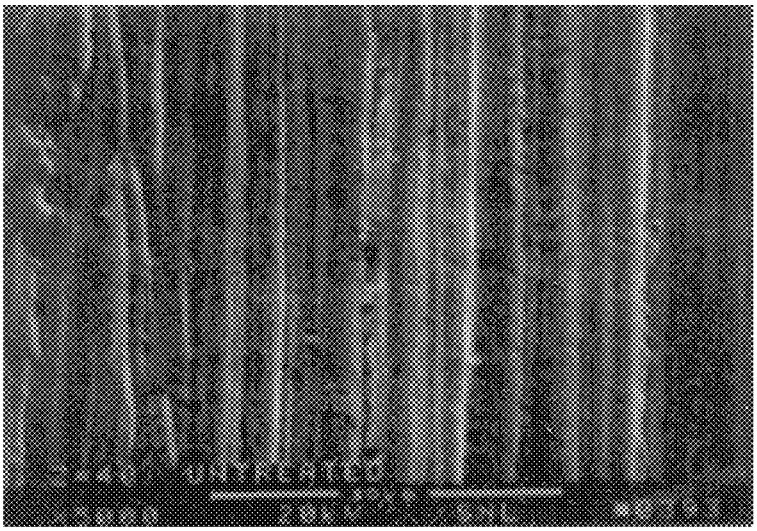
FIGS. 7a depicts a sample of Ti-6A1-4V alloy after treatment with a 300 keV, 2–4 J/cm$^2$ beam of mixed protons and carbon resulting in polishing of pre-existing machining marks with 10 $\mu$m roughness depicted in FIG. 7b to <1 $\mu$m.
Figure 7A:
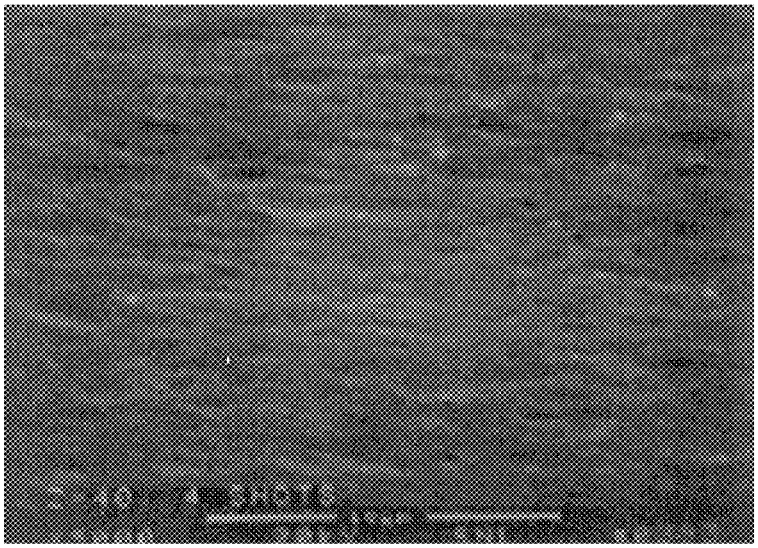
Figure 8A:
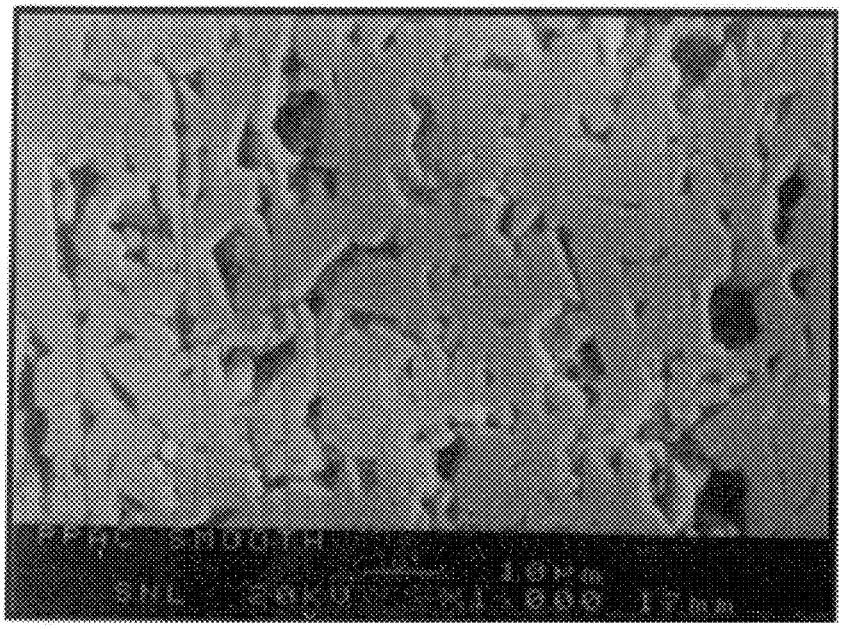
FIGS. 8a and 8b depict the before and after results of polishing an alumina sample which was subjected to a 60 ns, 10 J/cm$^2$, 1 MeV beam of mixed protons and carbon resulting in surface melting and re-solidification.
Figure 8B:
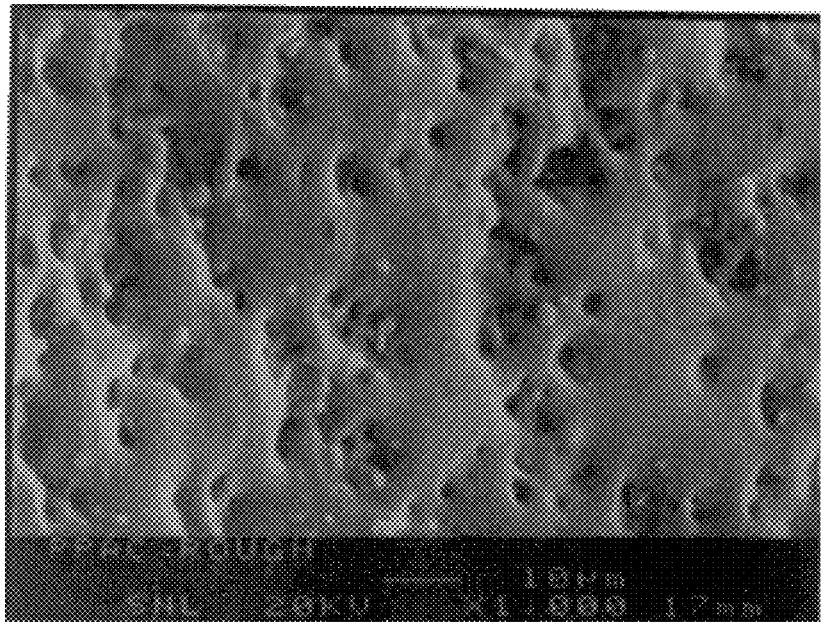

Examples of thermal surface treatment using this process are shown in FIGS. 5, 6, 7a, 7b and 8a, 8b. Surface cleaning or preparation without the use of organic solvents, can be accomplished by choosing higher mass ions (e.g. nitrogen, carbon) to deposit all of the beam energy in an approximately 1 μm thin region at the surface of the material, producing high surface temperatures which vaporize this contaminant-containing layer without significantly disturbing the underlying material. In particular, FIG. 5 depicts a stainless steel 304 sample, which was initially coated with machining oil, producing a 100 nm thick coating of hydrocarbons, after treatment with 1–2 Joules per square centimeter of 0.75 MeV carbon ions the hydrocarbon contamination layer was removed leaving only normal atmospheric contamination FIG. 6 is a cross sectional view of an 0–1 tool steel sample showing the effects of rapid surface melting and cooling after exposure by a 60 ns, 10 J/cm$^2$, 1 MeV mixed proton and carbon beam which resulted in increased hardness as well as a mixture of amorphous and retained metastable austenite with dissolved carbide precipitates that are retained in solution. FIGS. 7a depicts a sample of Ti-6A1-4V alloy after treatment with a 300 keV, 2–4 J/cm$^2$ beam of mixed protons and carbon resulting in polishing of pre-existing machining marks with 10 μm roughness to <1 μm depicted in FIG. 7b. By inducing surface melting, porous dielectric films can be sealed or metal surfaces "polished" by material reflow. FIG. 8 depicts a sample of polished alumina which was subjected to a 60 ns, 10 J/cm$^2$, 1 MeV beam of mixed protons and carbon resulting in surface melting and re-solidification.

Unlike lasers which deposit energy to metals in the near surface (≈30 nm) only, an ion beam deposits its energy throughout its penetration depth extending to several microns. Additionally ion beams have the unique capability to deposit energy preferentially near the end of their penetration depth, in the interior of the sample, due to the inverse dependence of ion stopping power and energy. In addition to improving adhesion between the coating and substrate over large areas, the thermal fatigue resistance can also be enhanced. In a ceramic/metal system thermal-expansion-generated stresses at the boundary can be distributed over a relatively thick boundary layer following pulsed melting rather than being concentrated at the original atomically sharp interface. The flexibility of choosing the ion beam species and energy density provide substantial control over the degree of mixing, especially for dissimilar materials.

Another related application of this technology is in the use of its rapid quenching and surface smoothing capability to produce thin layers of amorphous material with much higher quench rates and at much lower cost than is possible using existing splat-quenching techniques. The use of this technology to form very fine grain materials is also valuable in advanced battery applications.

The capability of the present invention for producing high purity, high average power ion beams results in the potential for a new, low cost, compact surface treatment technology capable of high volume commercial applications and new treatment techniques not possible with existing systems. Having thus described the present invention with the aid of specific examples, those skilled in the art will appreciate that other similar combinations of the capabilities of this technology are also possible without departing from the scope of the claims attached herewith.

We claim:

1. A method of surface treating a material, comprising the step of irradiating a surface of the material with a repetitively pulsed ion beam, wherein each spatially contiguous pulse of the pulsed ion beam has a duration of ≦500 ns at an accelerating gap between a cathode and an anode assembly, a total beam energy delivered to the material of >1 Joule/pulse, an impedance of < about 100 Ω, an ion kinetic energy of>50 keV, and a repetition rate >1 Hz.

2. The method of claim 1, further including controlling the depth of surface treatment of the material by controlling the ion species comprising the ion beam.

3. The method of claim 1, further including controlling the depth of surface treatment of the material by controlling the kinetic energy level of the ion beam.

4. The method of claim 1 further including controlling the depth of surface treatment by controlling the duration of the ion beam pulse between ≧30 ns and ≦200 ns.

5. The method of claim 1, further including the step of surface treating at least 100 cm$^2$ with each pulse of the ion beam.

6. The method of claim 1, further including the step of surface treating 100 to 1000 cm$^2$ with each pulse of the ion beam.

7. The method of claim 1, further including the step of thermally quenching the irradiated surface of material.

8. The method of claim 7, wherein the rate of quenching the irradiated material is at least $10^8$ K/sec.

9. The method of claim 2, wherein the ion species are selected from the group consisting of argon, nitrogen, carbon, and protons.

10. The method of claim [1] *2*, wherein the ion species are produced from molecules selected from the group consisting of gases, vaporizable liquids, and vaporizable solids.

11. The method of claim 1 wherein the characteristic is the removal of surface contamination.

12. A method for altering the characteristics of a near surface layer of material, comprising:

(a) generating a repetitively pulsed ion beam, wherein the ion beam has an ion kinetic energy level >0.1 MeV, a pulse duration of ≦500 ns at an accelerating gap between a cathode and an anode assembly, a total beam energy delivered to the material of >1 Joule/spatially contiguous pulse, an impedance of < about 100 Ω, and a pulse repetition rate >1 Hz; and (b) irradiating the surface of the material with the ion beam and thereby altering the near surface layer of the material defined by a predetermined depth from the irradiated surface.

13. The method of claim 12, further comprising varying the depth of the near surface layer thermally altered by controlling the kinetic energy of the ion species composing the ion beam.

14. The method of claim 12, further including varying the depth of the near surface layer thermally altered by varying the ion species composing the ion beam.

15. The method of claim 12, wherein the step of altering a near surface layer of material produces melting.

16. The method of claim 12, further including the step of thermally quenching the near surface layer of material.

17. The method of claim 16, wherein the rate of thermally quenching is at least $10^8$ K/sec.

18. The method of claim 16, wherein the step of thermally quenching further includes retaining non-equilibrium microstructures within the near surface layer selected from the group consisting of: amorphous, disordered crystalline and nano crystalline phases.

19. The method of claim 12, *wherein the near surface layer includes a layer of a first material and a layer of a second material and* further including the step of controlling the predetermined depth of altering of material to include an interface between [a] *the* layer of a first material and [a] *said* layer of a second material for bonding the first material to the second material, wherein the layers of the first and second materials are included within the near surface layer.

20. The method of claim 12 wherein the step of altering a near surface layer of material produces etching of polymers.

21. The method of claim 12 wherein the step of altering a near surface layer of material produces cross-linking of polymers.

22. The method of claim 12 wherein the step of altering a near surface layer of material produces polishing of the material.

23. The method of claim 12 wherein the step of altering a near surface layer of material produces cleaning of the material.

24. The method of claim 12 wherein the step of altering a near surface layer of material produces glazing of the material.

25. The method of claim 12 wherein the material is a metal and the characteristic is hardness.

26. The method of claim 25 wherein the metal is steel.

27. The method of claim 12 wherein the characteristic is surface smoothness.

28. The method of claim 27 wherein the material is a ceramic.

29. The method of claim 27 wherein the material is a metal composition.

30. An ion beam generator for altering near surface layers of materials, comprising:

a) means for repetitively generating pulsed power signals at a rate >1 Hz, wherein the pulsed power signal has a duration of 30–500 ns, and b) means for generating an ion beam in a magnetically confined plasma with the pulsed power signal, whereby pulsed ion beams are produced at rates >1 Hz and 30–500 ns in duration at an accelerating gap between a cathode and an anode assembly with a total beam energy delivered to the material of >1 Joule/spatially contiguous pulse and an impedance of < about 100 Ω.

31. The ion beam generator of claim 30, wherein the means for generating an ion beam includes:

an anode assembly comprising inner and outer anode rings defining an anode annulus there between, a cathode assembly comprising inner and outer cathode rings defining a cathode annulus there between wherein the inner and outer cathode rings also contain slow magnetic coils which, when energized, act to magnetically insulate the accelerating gap between the anode electrode rings and the cathode electrode rings, means to pre-ionize a gas introduced into the means for generating an ion beam, and means for completely ionizing the gas into the plasma and for moving the plasma comprising fast driving magnetic coil means which move the plasma towards and through the anode annulus into an accelerating gap between the anode assembly and the cathode assembly, wherein both the means to pre-ionize and the fast driving coil means are located to the side of the anode assembly opposite to the cathode assembly, wherein the inner and outer anode rings are configured so as to separate the magnetic field lines from the fast driving magnetic coil means from the magnetic field lines from the slow magnetic coils such that the magnetic field approaches zero across the cathode annulus at the time of beam acceleration and wherein the slow magnetic coils are located to the opposite side of the anode annulus relative to the fast driving magnetic coil means.

32. A process for uniformly altering a characteristic of a surface of a material to a depth of less than 50 microns by irradiating the surface with a repetitively pulsed ion beam, wherein each spatially contiguous pulse of the pulsed ion beam has a duration of ≦500 ns, a total beam energy delivered to the material of >1 Joule/pulse, an impedance of <100 Ω, and a repetition rate >1 Hz, such that continuous areas in excess of 50 $cm^2$ are created with the altered characteristic by each pulse.

33. A process for uniformly altering a characteristic of a surface of a material to a depth of less than 50 microns by irradiating the surface with a repetitively pulsed ion beam, wherein each spatially contiguous pulse of the pulsed ion beam has a duration of ≦500 ns, a total beam energy delivered to the material of >1 Joule/pulse, an impedance of <100 Ω, and a repetition rate >1 Hz, such that continuous areas in excess of 5 $cm^2$ are created with the altered characteristic by each pulse.

*34. The method according to claim 5 wherein a transition is created between a treated and untreated area of the*

*material and the step of irradiating results in no significant edge effects at said transition.*

*35. The method according to claim 6 wherein a transition is created between a treated and untreated area of the material and the step of irradiating results in no significant edge effects at said transition.*

*36. The method according to claim 1 wherein the material is a metal.*

*37. The method according to claim 1 wherein the material is a semiconductor.*

*38. The method according to claim 1 wherein the material is a polymer.*

*39. The method according to claim 1 wherein the material is a ceramic.*

*40. The method according to claim 1 wherein said surface treatment comprises annealing.*

*41. The method according to claim 1 wherein said surface treatment comprises modification of the surface microstructure of said material.*

*42. The method according to claim 1 wherein said surface treatment comprises vaporization of at least a portion of said surface layer.*

*43. The method according to claim 12 wherein the step of irradiating comprises thermally heating the material without significantly altering its atomic composition.*

*44. The method according to claim 12 wherein the near surface layer includes a layer of a first material and a layer of a second material and further including the step of controlling the predetermined depth of altering of material to include an interface between the layer of a first material and the layer of a second material for mixing said first and second layer materials by liquid phase mixing.*

*45. The method according to claim 12 wherein said step of altering further comprises implanting ions in said surface layer.*

*46. The method according to claim 12 wherein said characteristic is hardness.*

*47. The method according to claim 46 wherein said step of altering comprises producing surface ablations in said workpiece.*

*48. The ion beam generator according to claim 30, wherein the means for generating an ion beam includes:*

*an anode assembly comprising inner and outer anode rings defining an anode annular gap therebetween;*

*a cathode assembly comprising inner and outer cathode rings defining a cathode annulus there between wherein the inner and outer cathode rings also contain slow magnetic coils which, when energized, act to magnetically insulate the accelerating gap between the anode electrode rings and the cathode electrode rings;*

*means to pre-ionize a gas introduced into the means for generating an ion beam; and*

*means for completely ionizing the gas into the plasma and for moving the plasma comprising fast driving magnetic coil means which move the plasma towards and through the anode annulus into an accelerating gap between the anode assembly and the cathode assembly, wherein both the means to pre-ionize and the fast driving coil means are located to the side of the anode assembly opposite to the cathode assembly,*

*wherein the inner and outer anode rings are configured to separate the magnetic field lines from the fast driving magnetic coil means from the magnetic field lines from the slow magnetic coils in said annular gap at the time of beam acceleration and wherein the slow magnetic coils are located to the opposite side of the anode annulus relative to the fast driving magnetic coil means.*

*49. The method according to claim 32 where a transition is created between an altered and unaltered area of the material and the step of irradiating results in no significant edge effects at said transition.*

*50. The method according to claim 33 wherein a transition is created between a treated and untreated area of the material and the step of irradiating results in no significant edge effects at said transition.*

*51. An ion beam generator for altering near surface layers of materials, comprising:*

*a) a magnetically switched, high energy, a low impedance pulsed power system for producing a repetitively pulsed power signal; and*

*b) a magnetically confined anode plasma pulsed ion beam source having a cathode and an anode defining therebetween an acceleration gap for producing a pulsed ion beam, said ion beam being extractable from said ion beam source whereby said ion beam may propagate through an essentially magnetic field free region with little or no rotation.*

*52. The ion beam generator according to claim 51 wherein the pulsed power signal has a duration of 30–500 ns.*

*53. The ion beam generator according to claim 51 wherein the pulsed ion beam has pulses of 30–500 ns in duration in said acceleration gap with a total beam energy delivered to the material of >1 Joule/spatially contiguous pulse and an impedance of < about 100 Ω.*

*54. The ion beam generator according to claim 51 wherein:*

*said anode comprises an anode assembly having inner and outer anode rings defining an anode annular gap therebetween;*

*said cathode comprises a cathode assembly having inner and outer cathode rings defining a cathode annular gap therebetween, said inner and outer cathode rings further comprising a slow magnetic coil which, when energized, acts to magnetically insulate the accelerating gap;*

*a gas delivery assembly for introducing gaseous material upstream of the anode in the direction of flow of said gasious material;*

*means for preionizing said gaseous material;*

*a fast driving magnetic coil for ionizing said gaseous material into a plasma and for moving the plasma into the accelerating gap;*

*wherein the inner and outer anode rings are configured so as to separate the magnetic field lines from the fast driving magnetic coil from the magnetic field lines from the slow magnetic coil at the time of the beam acceleration, said slow magnetic coil being positioned opposite the anode annular gap relative to the fast driving magnetic coil.*

*55. The ion beam generator according to claim 51 wherein said pulsed power system is operable to deliver voltage of less than about 2.5 MV.*

*56. The ion beam generator according to claim 52 wherein said pulsed power system operates at an impedance of less than about 100 Ω.*

*57. The ion beam generator according to claim 51 wherein said magnetically confined anode plasma source is operable to provide pure beams of a predetermined ion species.*

*58. The ion beam generator according to claim 54 wherein said gas delivery assembly comprises a nozzle for introducing a gas puff proximate to said fast driving coil.*

59. The ion beam generator according to claim 58 wherein said nozzle is a supersonic nozzle.

60. The ion beam generator according to claim 54 wherein said means for preionizing means comprises an electric field generator for inducing an electric field in the gas.

61. The ion beam generator according to claim 54 wherein said gas delivery assembly comprises a source of gas for forming a plasma.

62. The ion beam generator according to claim 61 wherein said gas is selected from group comprising hydrogen, nitrogen and argon.

63. The ion beam generator according to claim 61 further comprising a source of gas, said source of gas comprising a vaporizable liquid or metal.

64. The ion beam generator according to claim 61 wherein said gas source comprises at least one of a vaporizable liquid or metal and a gas selected from the group comprising hydrogen, nitrogen and argon.

65. The ion beam generator according to claim 54 further comprising a vacuum chamber enclosing a target plane where material may be positioned for treatment, wherein said ion beam propagates through said vacuum chamber to said target plane.

66. The ion beam generator in accordance with claim 65 wherein the vacuum chamber includes said essentially magnetic field free region and said ion beam is extracted from said ion beam source into said magnetic field free region with little or no rotation.

67. The ion beam generator according to claim 65 further comprising means for forming a virtual cathode consisting of electrons emitted by said cathode, said virtual cathode extending proximate to the anode assembly to thereby increase the ion flow across the accelerating gap.

68. The ion beam generator according to claim 51 wherein an output of said high energy, low impedance pulsed power system is applied to said anode to accelerate ions from a plasma in said magnetically confined anode plasma source to thereby form said pulsed ion beam.

69. The ion beam generator according to claim 51 wherein said repetitively pulsed power signal produces a pulsed ion beam at a frequency of >1 Hz.

70. A method of forming a pulsed ion beam using a magnetically confined anode plasma, an ion beam source having an anode assembly, a cathode assembly, a slow magnetic field coil associated with said cathode assembly, a fast driving magnetic field coil, an acceleration gap between said anode assembly and cathode assembly, a gas injection device, and a target plane, comprising the steps of:

a) introducing a gas puff into a region between said fast driving coil and said anode assembly;

b) pre-ionizing said gas;

c) energizing said fast driving magnetic field coil to create a plasma from said preionized gas;

d) guiding said plasma into a magnetically confined plasma layer in the anode assembly;

e) applying pulsed energy to said accelerating gap using a magnetically switched pulsed power system to thereby accelerate ions from said plasma to form a pulsed ion beam; and f) extracting said ion beam from the plasma layer and directing said pulsed ion beam through an essentially magnetic field free region toward said target plane with little or no rotation thereof.

71. The method according to claim 70 wherein the step of extracting comprises the steps of propagating and focusing said pulsed ion beam at said target plane with little or no rotation thereof.

72. The method according to claim 70 wherein the gas is selected from the group consisting of hydrogen, nitrogen and argon.

73. The method according to claim 70 wherein the gas is generated from high vapor pressure liquid or metal.

74. The method according to claim 70 further comprising the step of forming a virtual cathode proximate to end opposite said anode assembly.

75. The method according to claim 74 wherein said step of forming a virtual cathode comprises forming a virtual cathode using electrons from said cathode assembly.

76. The method according to claim 75 wherein the electrons are confined so as to form a sheath extending from the cathode assembly to the anode assembly in an ion emitting region of the anode assembly.

77. The method according to claim 70 wherein the step of applying pulsed power the anode assembly comprises applying pulsed power of less than about 2.5 MV.

78. The method according to claim 77 wherein the magnitude of the applied voltage is determined based on the desired depth of penetration of the ions into the material to be irradiated.

79. The method of claim 76 further comprising maintaining the impedance of said ion beam source at < about 100 Ω.

80. The method according to claim 71 further comprising the step of maintaining a vacuum of at least about $1\times10^{-3}$ Torr in the region between said plasma layer and said target plane during substantially the entire interval between ion pulses.

81. The method according to claim 71 wherein the step of directing further comprises propagating said ion beam through a magnetic field free region and then focusing said ion beam on a material surface positioned on said target plane.

82. The method according to claim 81 further comprising the step of separating said target plane from said ion beam source by at least about 20 cm.

83. The method according to claim 70 further comprising the step of pulsing said ion beam at a repetition rate of >1 Hz.

84. A method of producing a high energy vapor for depositing films comprising the step of:

a) generating a repetitively pulsed ion beam using a magnetically confined anode plasma ion beam source and magnetically switched pulsed power source applied to an acceleration gap thereof, wherein the ion beam has an ion kinetic energy level >0.1 MeV, a pulse duration of <500 ns at said acceleration gap, a total beam energy delivered to the material of >1 Joule/spatially contiguous pulse, and an impedance of < about 100 Ω;

b) extracting the pulsed ion beam from said source with little or no rotation thereof; and c) irradiating the surface of a material with the ion beam to vaporize a surface layer thereof.

85. The method according to claim 84 further comprising the step of:

depositing said vaporized material on a substrate to thereby form a film on said substrate.

86. The method according to claim 84 wherein said repetitively pulsed ion beam has a pulse repetition rate of >1 Hz.

* * * * *